United States Patent
Sykes

(10) Patent No.: US 9,618,557 B2
(45) Date of Patent: Apr. 11, 2017

(54) DIAGNOSTIC CIRCUIT OF A VOLTAGE SUPPRESSION CIRCUIT IN A DRIVE CIRCUIT OF A FLUID INJECTOR AND METHOD FOR DIAGNOSING A FAULT IN THE VOLTAGE SUPPRESSION CIRCUIT

(71) Applicant: DELPHI INTERNATIONAL OPERATIONS LUXEMBOURG S.A.R.L., Bascharage (LU)

(72) Inventor: Martin A. P. Sykes, Rainham (GB)

(73) Assignee: Delphi International Operations Luxembourg SARL, Luxembourg (LU)

(*) Notice: Subject to any disclaimer, the term of this patent is extended or adjusted under 35 U.S.C. 154(b) by 27 days.

(21) Appl. No.: 14/420,451

(22) PCT Filed: Jul. 30, 2013

(86) PCT No.: PCT/EP2013/066004
§ 371 (c)(1),
(2) Date: Feb. 9, 2015

(87) PCT Pub. No.: WO2014/048614
PCT Pub. Date: Apr. 3, 2014

(65) Prior Publication Data
US 2015/0204930 A1 Jul. 23, 2015

(30) Foreign Application Priority Data
Sep. 26, 2012 (GB) .................................. 1217149.2

(51) Int. Cl.
*G01R 31/00* (2006.01)
*G01R 31/02* (2006.01)
(Continued)

(52) U.S. Cl.
CPC ......... *G01R 31/006* (2013.01); *F01N 3/2066* (2013.01); *F01N 11/00* (2013.01);
(Continued)

(58) Field of Classification Search
CPC ... G01R 31/006; G01R 31/025; F01N 3/2066; F01N 11/00; F01N 2900/0422;
(Continued)

(56) References Cited

U.S. PATENT DOCUMENTS 3,533,381 A * 10/1970 Rabus .................... F02D 41/064
                                                            123/179.16
4,024,850 A * 5/1977 Peter ........................ F01N 9/00
                                                            116/200

(Continued)

FOREIGN PATENT DOCUMENTS

DE    41 30 712 A1    3/1993
EP    0 150 492 A2    8/1985
(Continued)

OTHER PUBLICATIONS

International Search Report dated Jan. 1, 2014.

*Primary Examiner* — Billy Lactaoen
(74) *Attorney, Agent, or Firm* — Joshua M. Haines

(57) ABSTRACT

A diagnostic circuit arranged to measure an electrical characteristic in a drive circuit of a coil of a fluid injector and compare the measured electrical characteristic with another electrical characteristic to determine whether a PN junction is working to discharge electrical energy in the coil of the fluid injector, in particular a selective catalytic reduction dosing injector.

11 Claims, 10 Drawing Sheets

(51) Int. Cl.
  *F02D 41/22* (2006.01)
  *H01F 7/18* (2006.01)
  *F01N 3/20* (2006.01)
  *F01N 11/00* (2006.01)
  *F02D 41/20* (2006.01)

(52) U.S. Cl.
  CPC .......... *F02D 41/20* (2013.01); *F02D 41/221* (2013.01); *G01R 31/025* (2013.01); *H01F 7/1844* (2013.01); *F01N 2550/05* (2013.01); *F01N 2900/0422* (2013.01); *F01N 2900/1821* (2013.01); *F02D 2041/2034* (2013.01); *F02D 2041/2041* (2013.01); *F02D 2041/2051* (2013.01); *F02D 2041/2058* (2013.01); *F02D 2041/2068* (2013.01); *F02D 2041/2089* (2013.01); *Y02T 10/24* (2013.01); *Y02T 10/40* (2013.01); *Y02T 10/47* (2013.01)

(58) Field of Classification Search
  CPC ......... F01N 2900/1821; F01N 2550/05; F02D 41/221; F02D 41/20; F02D 2041/2041; F02D 2041/2089; F02D 2041/2034; F02D 2041/2068; F02D 2041/2051; F02D 2041/2058; H01F 7/1844; Y02T 10/47; Y02T 10/24; Y02T 10/40
  USPC ....................................................... 324/503
  See application file for complete search history.

(56) References Cited

U.S. PATENT DOCUMENTS

| | | | |
|---|---|---|---|
| 2004/0155121 A1* | 8/2004 | Watanabe | F02D 41/20 239/533.2 |
| 2009/0213519 A1* | 8/2009 | Bedingfield | H01F 7/1805 361/140 |
| 2012/0112771 A1* | 5/2012 | Schliebe | G01R 31/06 324/659 |

FOREIGN PATENT DOCUMENTS

| | | |
|---|---|---|
| EP | 2 006 517 A2 | 12/2008 |
| GB | 2 279 829 A | 1/1995 |
| JP | 2006 220069 A | 8/2006 |
| JP | 2006220069 A * | 8/2006 |

\* cited by examiner down voltage of the PN junction within 300 microseconds of
DIAGNOSTIC CIRCUIT OF A VOLTAGE SUPPRESSION CIRCUIT IN A DRIVE CIRCUIT OF A FLUID INJECTOR AND METHOD FOR DIAGNOSING A FAULT IN THE VOLTAGE SUPPRESSION CIRCUIT

CROSS REFERENCE TO RELATED APPLICATIONS

This application is a national stage application under 35 U.S.C. 371 of PCT Application No. PCT/EP2013/066004 having an international filing date of 30 Jul. 2013, which designated the United States, which PCT application claimed the benefit of Great Britain Patent Application No. 1217149.2 filed on 26 Sep. 2012, the entire disclosure of each of which are hereby incorporated herein by reference.

FIELD OF THE INVENTION

The invention broadly relates to a diagnostic circuit. Specifically, but not exclusively, the invention relates to a diagnostic circuit for a fluid injector configured for use on a vehicle, such as a water injector or fuel injector. Most specifically the invention relates to a diagnostic circuit for a selective catalytic reduction dosing injector. The invention also relates to a method for diagnosing a fault in said fluid injector.

BACKGROUND OF THE INVENTION

An aim of the invention is to provide a diagnostic circuit which provides an improved reliability check on the operation of a fluid injector, most particularly a selective catalytic reduction (SCR) dosing injector. Another aim is to provide improved compatibility between a variety of control circuits, most particularly engine control units (ECUs) and fluid injectors.

SUMMARY OF THE INVENTION

In summary, the invention relates to fluid injector, and particularly a selective catalytic reduction (SCR) dosing injector. In an example embodiment, the fluid injector comprises a pump plunger able to move from a first position to a second position to drive fluid, typically urea, water or fuel, through the fluid injector. The coil is arranged to drive the pump plunder to the second position when the coil is energised. The pump plunger is biased to return to a first position, typically by a spring, when the coil is de-energised. A voltage suppressor or other means is provided to quickly and reliably discharge stored electrical energy in the coil when a drive signal is turned off. The voltage suppressor should ideally be able to operate within an engine bay environment and at frequencies of operation typically found with SCR dosing injectors or water or fuel injectors.

According to the invention, there is provided a diagnostic circuit. In one example, the diagnostic circuit is arranged to measure an electrical characteristic in a drive circuit of a coil of the fluid injector, and particularly a selective catalytic reduction (SCR) dosing injector. The diagnostic circuit compares the measured electrical characteristic with another electrical characteristic to determine whether a PN junction is working to discharge electrical energy stored in the coil of the injector. In one example, the diagnostic circuit is arranged to measure the electrical characteristic during an off-phase of the drive circuit. The diagnostic circuit may be arranged to measure the electrical characteristic during a time period of 500 microseconds from the beginning of the off-phase of the drive circuit. The diagnostic circuit may be arranged to measure current in the drive circuit. Typically, the diagnostic circuit is arranged to measure current through a sense resistor in the drive circuit. Ideally, the diagnostic circuit is arranged to determine whether the current is above a value of one of 0.1, 0.2 and 0.3 amps after a time period of one of 50, 75, 100, 150 and 200 microseconds. In another example, the diagnostic circuit is arranged to measure voltage in the drive circuit. The diagnostic circuit may be arranged to measure voltage through a voltage divider in the drive circuit. The diagnostic circuit may be arranged to determine whether the voltage is above a breakdown voltage of the PN junction. Typically, the diagnostic circuit is arranged to determine whether the voltage is above a breakdown voltage of the PN junction within 300 microseconds of the beginning of an off-phase of the drive circuit. In another example, the diagnostic circuit may be arranged to measure the electrical characteristic at a low side of the coil.

The invention also relates to a method for diagnosing a fault with a drive circuit of a fluid injector, and particularly a selective catalytic reduction dosing injector. In one example, the method comprises measuring an electrical characteristic in a drive circuit of a coil of the fluid injector and comparing the measured electrical characteristic with another electrical characteristic to determine whether a PN junction is working to discharge electrical energy in the coil of the fluid injector.

In this way, the diagnostic circuit provides an improved reliability check of the performance of the drive circuit of a coil of a selective catalytic reduction dosing injector.

There is provided a diagnostic circuit and a method as set forth in the appended claims. Further features are described below.

The diagnostic circuit is particularly useful when used with a selective catalytic reduction dosing injector also described below. The selective catalytic reduction dosing injector comprises a coil arranged to drive a pump from a first state to a second state when energized, so as to pump a dosing fluid. The selective catalytic reduction dosing injector further comprises a PN junction electrically arranged across the coil to breakdown and discharge energy stored in the coil when an external drive voltage is removed from the coil, and when the voltage across the coil is above a breakdown voltage of the PN junction. In one example, the PN junction is within a diode electrically arranged across the coil. In another example, the PN junction is within a transient voltage suppressor electrically arranged across the coil. Optionally, the PN junction is directly connected to the coil. The PN junction may be soldered to terminals of the coil. The PN junction and the coil may share a cooling system. In one example, the PN junction and the coil may be within a common cooling jacket. Optionally, the breakdown voltage of the PN junction is lower than a breakdown voltage of another relevant PN junction in the drive circuitry. In another example, the selective catalytic reduction dosing injector is part of a dosing system and the energizing of the coil is controlled via an engine control unit. The catalytic reduction dosing injector may comprise a diagnostic circuit. In one example, the catalytic reduction dosing injection is configured to diagnose the satisfactory operation of the PN junction. The diagnostic circuit may be arranged to measure current decay during discharge of the coil. The diagnostic circuit may be arranged to measure a voltage decay during discharge of the coil. The voltage suppressor preferably comprises a transient-voltage-suppression diode. In one broad example, a PN junction is used. The PN junction is arranged to breakdown and discharge energy stored within the coil when a drive voltage is removed from the coil. The PN junction may be arranged so that the cathode is connected to the positive drive voltage terminal of the coil.

There is also described and provided a related method of discharging a coil of a selective catalytic reduction dosing injector. The method comprises supplying a coil of the dosing injector with electrical energy to drive a pump from a first state to a second state so as to pump a dosing fluid; stopping the supply of electrical energy to the coil; and allowing the electrical energy stored in the coil to dissipate through a PN junction electrically arranged across the coil. Optionally, the method comprises attaching a PN junction across the terminals of a coil, the coil arranged to drive a pump from a first state to a second state so as to drive a dosing fluid.

There is also described and provided a related method of assembling a fluid injector. The method comprises attaching a PN junction across the terminals of a coil, the coil arranged to drive a pump from a first state to a second state so as to drive a fluid.

Accordingly, an improved way of controlling the coil of an SCR dosing injector is provided, which also has the added advantage of making the SCR dosing injector more compatible with a broader range of engine control units (ECUs). Typically, the ambient conditions of an engine, together with the large amounts of energy being dissipated from the coil, mean that some types of ECU are not able to handle the energy dissipation from discharging the coil through internal components, such as through a low-side FET switch. Having a separate discharge means alleviates this problem and makes SCR dosing injectors of the type described compatible with a broader range of ECUs. Advantageously, the voltage suppressor is able to benefit from the cooling system already in place for the SCR dosing injector.

BRIEF DESCRIPTION OF THE DRAWINGS

Embodiments of the invention will now be described with reference to the accompanying drawings, in which.

DETAILED DESCRIPTION OF EMBODIMENTS

Embodiments of the invention will now be described with reference to the above-listed figures in order to illustrate an application or applications of the invention in a manner not intended to limit the scope of the invention.

Figure 1:
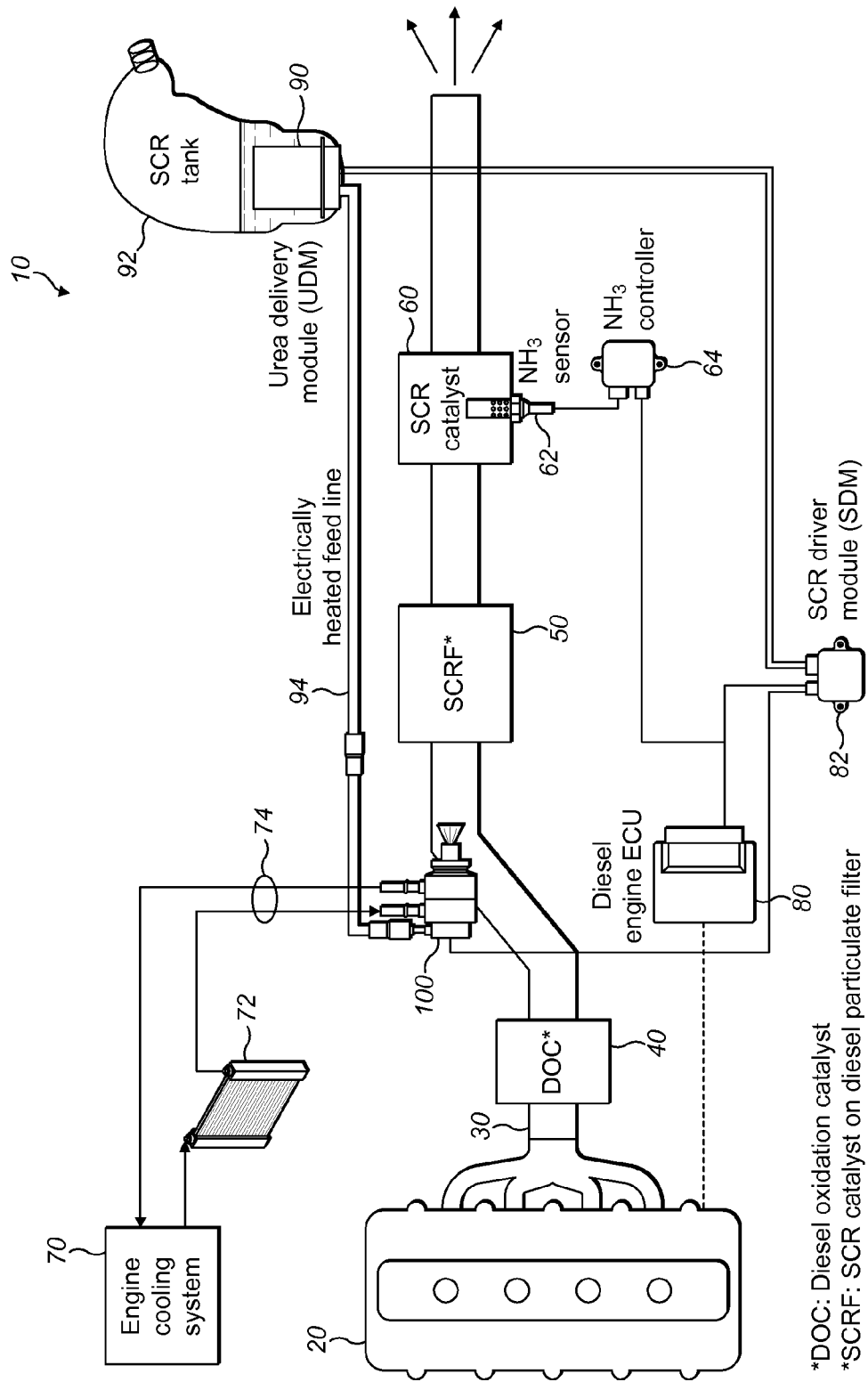
FIG. 1 is a schematic overview of a selective catalytic reduction dosing system in which the invention finds utility.

FIG. 1 is a schematic overview of a selective catalytic reduction (SCR) dosing system 10 installed in an exhaust pipe 30 of an engine 20. The exhaust pipe comprises a diesel oxidisation catalyst (DOC) 40, a SCR catalytic diesel particulate filter (SCRF) 50, and a SCR catalyst 60. The engine 20 comprises an engine cooling system 70 and an engine control unit (ECU) 80. The SCR dosing system 10 comprises a urea delivery module (UDM) 90 and a SCR dosing injector 100.

The SCR catalyst 60 includes a $NH_3$ sensor 62 and a $NH_3$ controller 64, which is arranged to feedback signals to the ECU 80 to control selective catalytic reduction within the system 10.

The engine cooling system 70 comprises a heat exchanger 72 and cooling lines 74 connected to the SCR dosing injector 100 in order to cool the SCR dosing injector 100.

The ECU 80 comprises an SCR driver module 82 arranged to control the UDM 90 and SCR dosing injector 100.

The UDM 90 comprises an SCR tank 92 containing the dosing fluid, in this case urea. The UDM 90 also comprises a feedline 94 to feed the dosing fluid to the SCR dosing injector 100. The feedline 94 is electrically heated.

The ECU 80 is typically located in the engine bay and will be required to operate in hot ambient conditions, in the region of 90° C. Most ECU components have a maximum operating temperature of around 125° C. Therefore, typically, the ECU 80 should not produce enough heat energy to raise the temperature of its components by more than 35° C. above the normal ambient operating temperature. If this happens, the chances of ECU component failure are greatly increased.

The temperature of exhaust fumes coming from the engine 20 into the exhaust pipe 30 can reach in the region of 800° C., especially during (diesel particulate filter) DPF regeneration events. Components which are nearby the exhaust pipe 30 can often be operating in ambient conditions in the region of 250° C.

Figure 2:
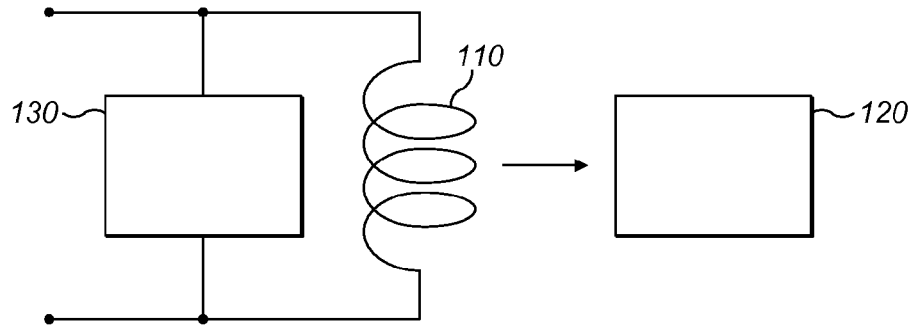
FIG. 2 is a schematic diagram showing elements of a selective catalytic reduction dosing injector in accordance with an embodiment of the invention.

FIG. 2 is a schematic diagram showing in more detail the SCR dosing injector 100 according to an embodiment of the invention. The SCR dosing injector 100 comprises a coil 110, a pump 120 and a voltage suppressor 130.

The coil 110 is arranged to drive the pump 120 from a first state to a second state when energized, so as to pump the dosing fluid into the exhaust pipe 30 as required for successful selective catalytic reduction. As mentioned earlier, control of the SCR dosing injector 100 is governed by the ECU 80 and SCR driver module 82 with inputs from the $NH_3$ controller.

The pump 120 comprises a pump plunger (not shown) which is able to move from a first position to a second position to pump the dosing fluid into the exhaust pipe 30. The first position of the pump plunger corresponds to the first state of the pump, and the second position of the pump plunger corresponds to the second state of the pump. The pump plunger is driven from the first position to the second position when the coil 110 is energized. A spring (not shown) is used to return the pump plunger to the first position when the coil 110 is de-energized. It is sometimes necessary to drive the pump from the first state to the second state quickly. The SCR dosing injector 100 is required to operate from between 1 Hz to 135 Hz. Also, the coil 110 uses between 5 to 10 watts of energy during normal operation, up to about 20 watts. The dosing injector 100 is not simply an electronically-actuated valve which injects pressurised fluid, but instead does the work necessary to pressurise and inject the fluid. Prior art injectors have tended to separate the pump and injector functions, with the pump acting to generate a pressurised fluid, the pump being controlled by control circuitry receiving sensor information on the pressure of a fluid feed line. Purging valves have also tended to be necessary, to protect against freezing. Injection pressures have typically been around 5 bar (approximately 500 kPa) for those types of prior art injectors. The dosing injector discussed in this example embodiment has a unified pump and injector which does away with pressure control, and also the purging valve. Injection pressures peaking at 50 bar (approximately 5000 kPa) are also achieved.

Importantly, the voltage suppressor 130 is arranged to be connected across the coil 110 and is arranged to discharge energy stored in the coil 110 when the voltage across the coil 110 is above a threshold, this occurs at the end of each injection event. In this embodiment, the coil 110 is energized with electrical energy during an on-phase and the electrical energy supply is switched off during an off-phase. When in the off-phase the energy stored in the coil 110 is sufficient to raise the voltage across the voltage suppressor 130 above a breakdown voltage, and the voltage suppressor 130 acts to discharge the energy stored in the coil 110. The energy which was stored in the coil 110 is mainly lost as heat. The voltage suppressor 130 in this example is a transient voltage suppressor with a breakdown voltage of 30 volts. A suitable voltage suppressor is marketed under the component number SMAJ30CA. This transient voltage suppressor has a 400 watt peak pulse power dissipation, and can operate up to 175° C. The voltage suppressor 130 is a bi-directional transient-voltage-suppression diode. The voltage suppressor 130 in this embodiment is soldered across terminals (not shown) of the coil 110. The coil 110 is surrounded by a cooling jacket (not shown) and the voltage suppressor 130 is contained within the cooling jacket of the coil 110 and shares the same liquid-cooled cooling system (illustrated earlier as engine cooling system 70).

In this way, the SCR dosing injector 100 becomes compatible with a broader range of ECUs than prior art systems. Each ECU need not have a dedicated design allowing it to dissipate the energy stored in the coil 110 during each cycle. The danger of an ECU heating above its maximum operating temperature rating is therefore greatly reduced, increasing engine reliability. By sharing the same cooling system as the SCR dosing injector 100 the voltage suppressor 130 can be kept within its own operating temperature range despite the fact it may be in close proximity to the exhaust pipe 30. This solution also removes the need for a further dedicated drive box or other modifications to other circuitry.

Of course, the skilled person would realise that another type of voltage suppressor 130 could be used, and in particular a diode (especially a zener diode), a transistor, and so on could be used.

There now exists a potential problem if the voltage suppressor 130 has a failure. The ECU 80 or SCR driver module 82 may not be capable of dissipating the energy in the coil 110 at all, or may not be able to dissipate the energy in the coil 110 sufficiently to avoid reliability problems.

Figure 3:
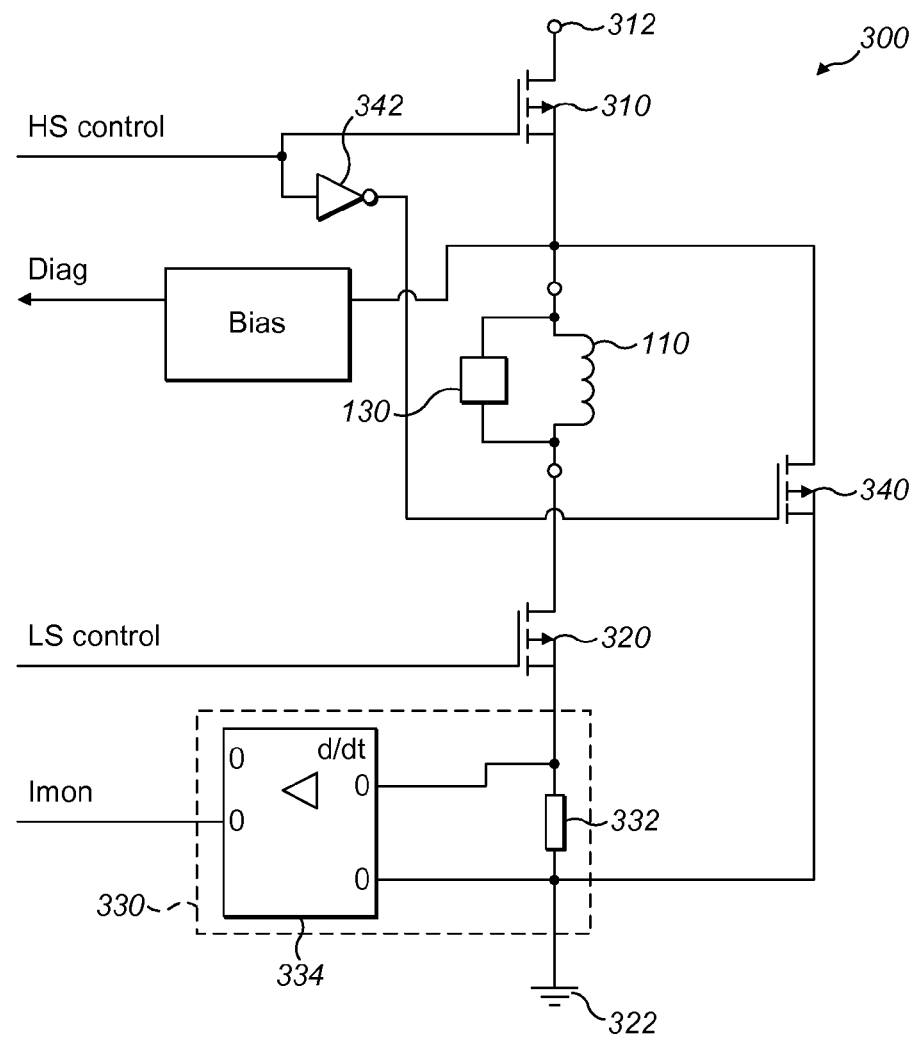
FIG. 3 is a circuit schematic of example drive circuitry used to drive the dosing injector of FIG. 2, where the drive circuitry includes a diagnostic circuit.

FIG. 3 is a circuit schematic of drive circuitry 300 used to drive the coil 110. The coil 110 is shown within the drive circuitry 300 in the schematic and, as will be realised, the coil 110 will be physically separated in most circumstances from the drive circuitry 300. Likewise the voltage suppressor 130 is shown within the drive circuitry 300, but will likely be located adjacent the coil 110 as already described above.

The drive circuitry 300 comprises a high side transistor switch 310 which connects a high side of the coil 110 to a battery terminal 312 so that a voltage typical of a vehicle battery may be applied across the coil 110. In most vehicles, this voltage will be in the region of 12 volts, and will be supplied by the vehicle battery. The drive circuitry 300 also comprises a low side transistor switch 320 which connects a low side of the coil 110 to a ground terminal 322 to complete the circuit for energising the coil 110. Both the high side transistor switch 310 and the low side transistor switch 320 have corresponding control signals which switch each respective transistor switch on and off, appropriately.

Importantly, the drive circuitry 300 comprises a coil diagnostic circuit 330. The coil diagnostic circuit 330 comprises a sense resistor 332 connected in series between the low side transistor switch 320 and the ground terminal 322. A voltage measurement module 334 has two input terminals connected across the sense resistor 332 and has an output which is arranged to output a signal indicative of the current through the sense resistor 332.

Also, the drive circuitry 300 comprises a freewheel transistor switch 340 which is arranged to connect a high side of the coil 110 to the ground terminal 322. The freewheel transistor switch 340 is controlled in an opposite way to the high side transistor switch 310, so that when one is on, the other is off.

Figure 4:
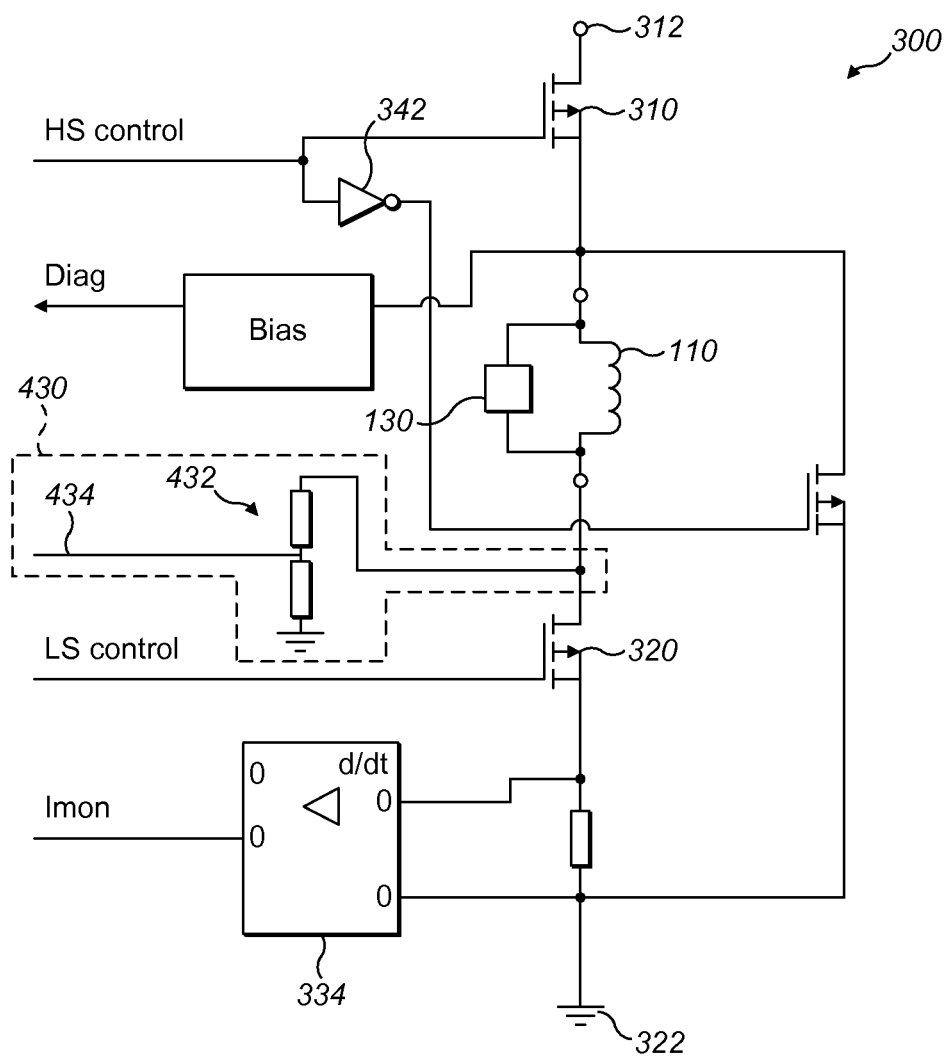
FIG. 4 is a circuit schematic showing the drive circuitry of FIG. 3 but including an alternative diagnostic circuit.

FIG. 4 is a circuit schematic of an alternative arrangement to that presented above with reference to FIG. 3. Here, like reference signs denote like components and they will not be described again. An alternative coil diagnostic circuit 430 is presented which senses voltage rather than current. Here, a voltage divider 432 is connected at a top end thereof between a low side of the coil 110 and the low side transistor switch 320. A voltage tap 434 is connected between two resistors of the voltage divider 432 so as to output a voltage reading.

Figure 5A:
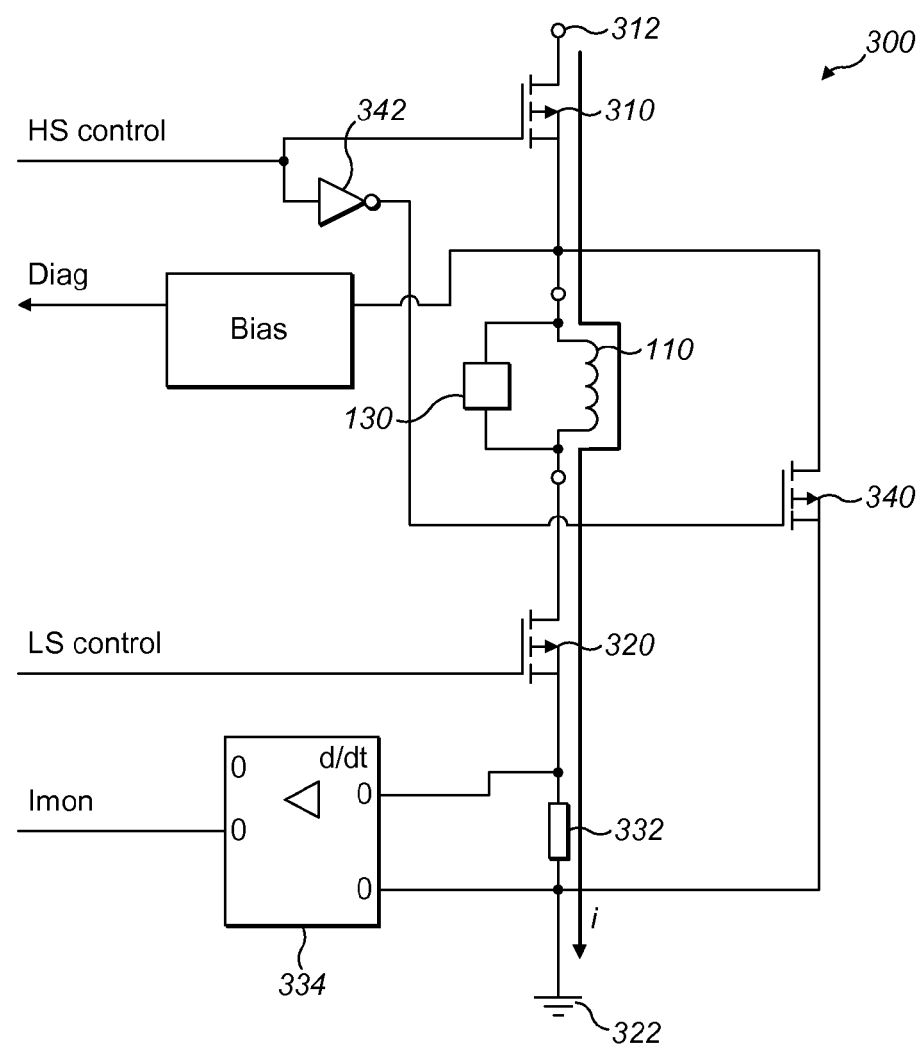
FIG. 5A is a circuit schematic showing current flow through the drive circuitry of FIG. 3 during an on-phase.

FIG. 5A is a circuit schematic showing the drive circuitry 300 of FIG. 3 during an on-phase. Here, a current shown as i passes from the battery terminal 312 down to the ground terminal 322 through high side transistor switch 310, coil 110, low side transistor switch 320 and sense resistor 332.

Figure 5B:
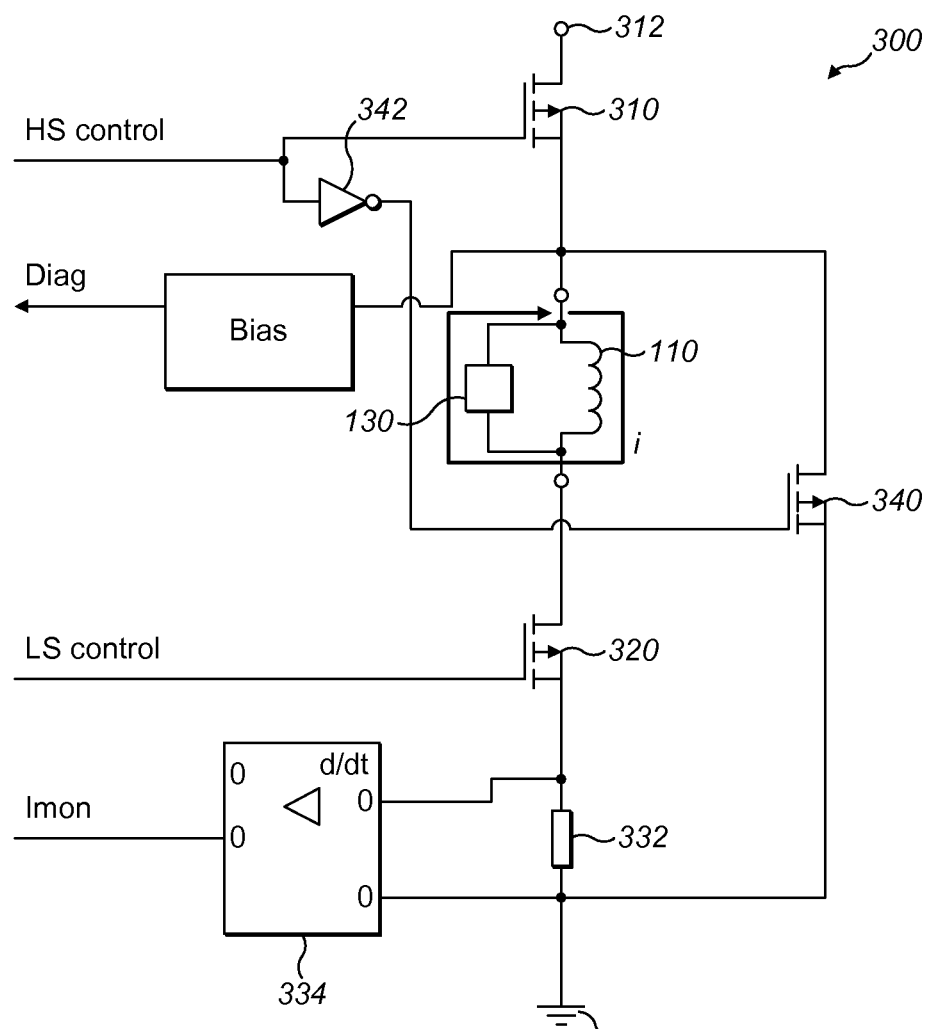
FIG. 5B is a circuit schematic showing current flow through the drive circuitry of FIG. 3 during an off-phase.

FIG. 5B is a circuit schematic showing the drive circuitry 300 during an off-phase. Here, the high side transistor switch 310 is in an open configuration, as is low side transistor switch 320. The current does not flow from the battery terminal 312 to the ground terminal 322. Instead, the energy in the coil 110 is dissipated directly through the voltage suppressor 130 and the current flows around in a loop not involving the drive circuitry 300. There is no, or substantially no, current flow in sense resistor 332.

Figure 6A:
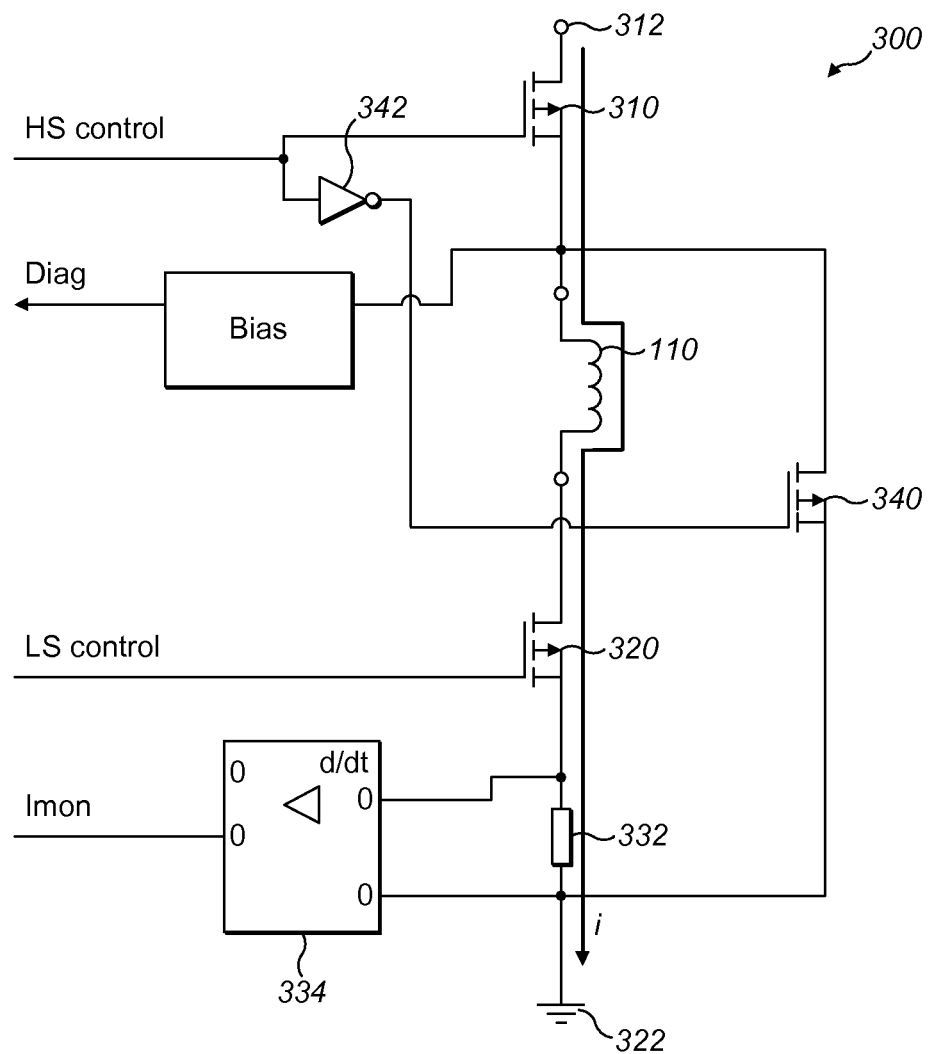
FIG. 6A is the circuit schematic of FIG. 5A showing current flow with a malfunctioning voltage suppressor.

FIG. 6A is a circuit schematic showing the drive circuitry 300 when there is a malfunction of the voltage suppressor. Here, as in FIG. 5A, the current flows as before during the on-phase of the drive circuitry. There is no difference during the on-phase in the current flow between a situation with a working voltage suppressor and a non-working voltage suppressor.

Figure 6B:
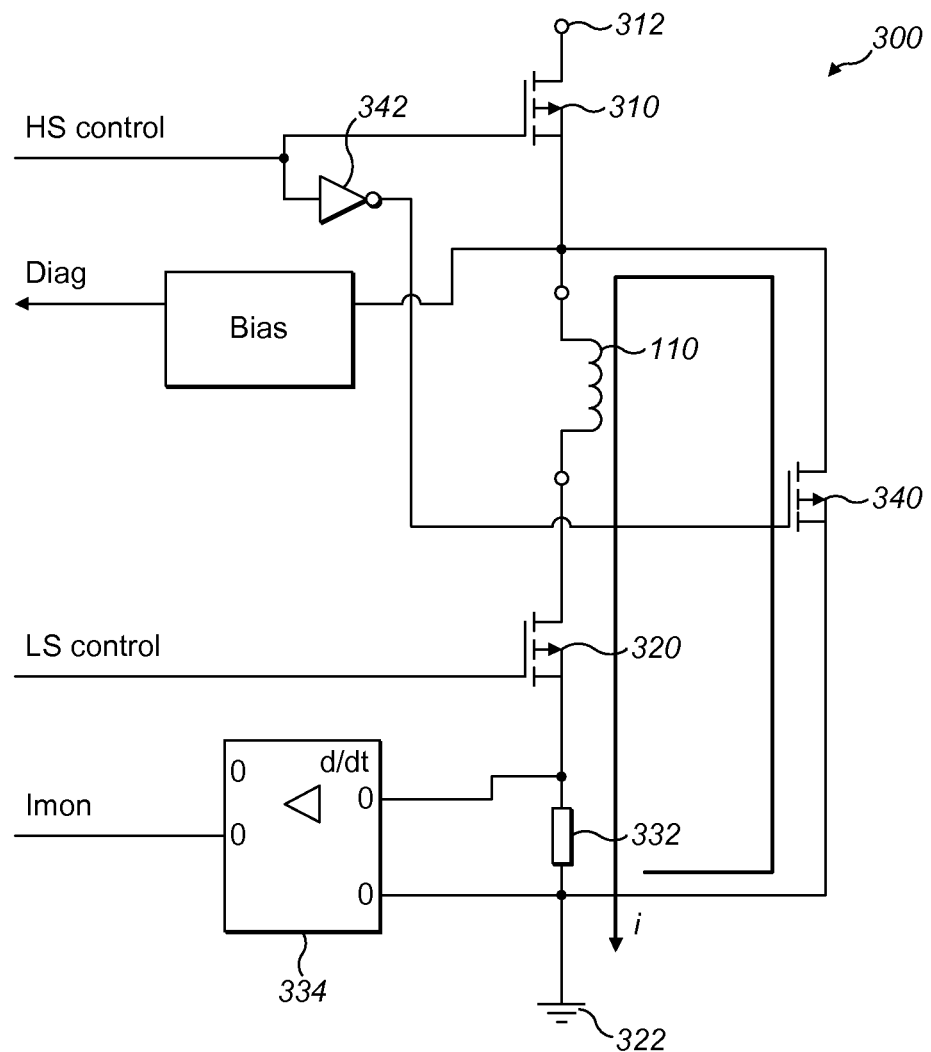
FIG. 6B is the circuit schematic of FIG. 5B showing current flow with a malfunctioning voltage suppressor.

FIG. 6B is a circuit schematic showing the drive circuitry 300 during an off-phase, again with the voltage suppressor 130 in a malfunctioning state. Here, unlike FIG. 5B the current does not flow in a loop through the coil 110 and voltage suppressor 130. Instead the freewheel transistor 340 connects the high side of the coil 110 to ground and the low side transistor switch 320 becomes closed due to the voltage at the low side of the coil 110 exceeding the breakdown voltage of the low side transistor switch 320. The current flows through the freewheel transistor switch 340 into the high side of the coil 110, through the coil 110, through the low side transistor switch 320, through the sense resistor 332 and to ground via the ground terminal 322.

As will be apparent now to the skilled reader, FIG. 6B demonstrates that the sense resistor 332 will sense a current for a period at the beginning of the off-phase. Also, the skilled reader will now realise that similar will be true for the circuit shown in FIG. 4. That is, a voltage would be generated at the voltage tap 434 at the beginning of the off-phase when the voltage suppressor 130 is in a malfunctioning state.

Figure 7:
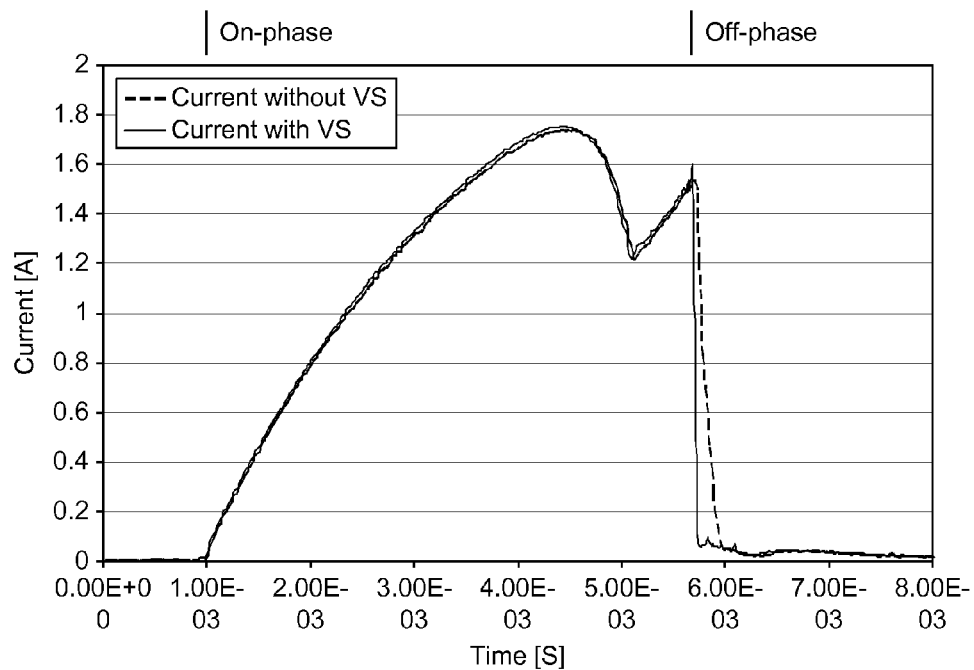
FIG. 7 is a graph of current sensed with a functioning and a non-functioning voltage suppressor.

To illustrate this further, FIG. 7 is a graph plotting time on the x-axis and current on the y-axis as measured by coil diagnostic circuit 330 through sense resistor 332. Two plots are drawn, the first (solid line) showing the current i when the voltage suppressor 130 is in normal working condition. Here we can see a sharp drop in the current through the sense resistor 332 when the off-phase commences. In other words, the current decay takes place in the loop shown in FIG. 5B and so is not measured by the sense resistor 332. The second plot (dashed line) shows the current i when the voltage suppressor 130 is malfunctioning, as shown in FIG. 6B. Here, the current i shows a decaying characteristic through the sense resistor. Noticing this current decay in the sense resistor 332 therefore allows an engine control unit or similar to determine that there is a malfunction in the voltage suppressor 130 and to take appropriate action, such as one or more of limiting the frequency of operation of the SCR dosing injector 100, limiting the amount of dosing fluid injected into the exhaust 30, and providing a warning signal to a user to seek maintenance of the engine. The current i in the sense resistor 332 decays from approximately 1.6 amps at the end of the on-phase to 0.2 amps or less approximately 50 microseconds into the off-phase when the voltage suppressor 130 is working and from 1.6 amps to 0.2 amps or less approximately 200 microseconds into the off-phase.

Figure 8:
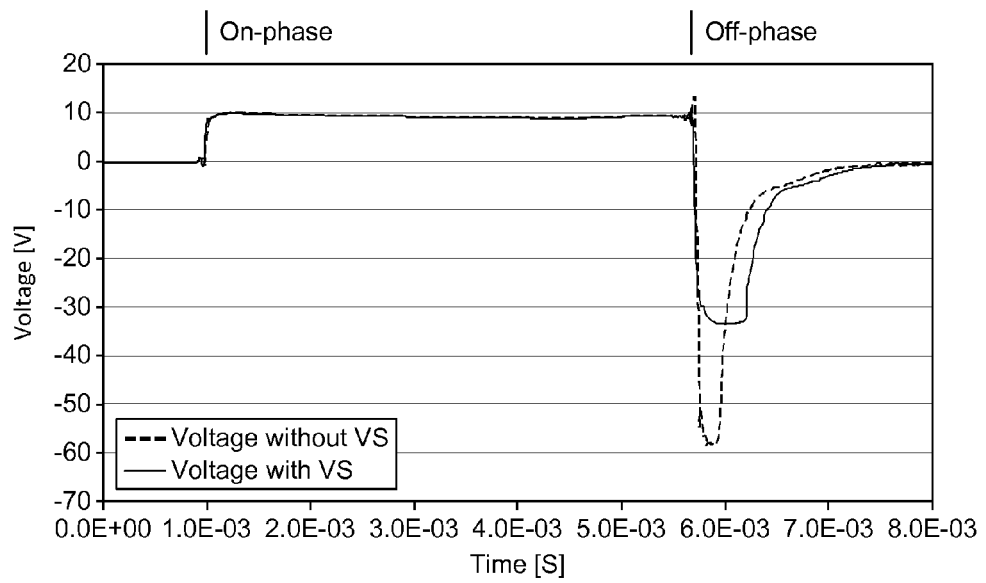
FIG. 8 is a graph of voltage sensed with a functioning and a non-functioning voltage suppressor.

FIG. 8 is a graph plotting voltage for the coil diagnostic circuit 430 shown in FIG. 4. Here, there is a plot of voltage across the coil 101 measured at the transition from the on-phase to the off-phase. As can be seen, during the on-phase the voltage across the coil 110 is at 10 volts, equal to the voltage of the battery in this example.

A first one of the plots (solid line) in the graph of FIG. 8 shows the potential difference across the coil 110 when the voltage suppressor 130 is operable. Here, we see that the potential difference across the coil 110 in the off-phase rises to around 33 volts (i.e. the potential difference equals the breakdown voltage of the voltage suppressor 130, which practically in this case is between 30 and 40 volts). The voltage across the coil 110 stays at this level for approximately 500 microseconds, and then rapidly drops to zero as all of the energy in the coil is dissipated through the voltage suppressor 130.

The second plot (dashed line) on the graph of FIG. 8 shows the potential difference across the coil 110 when the voltage suppressor 130 is in a malfunctioning state. Here, at the transition from the on-phase to the off-phase, the voltage across the coil 110 rapidly increases to a much greater amount than when the voltage suppressor 130 is in a working condition. In this case, the voltage across the coil 110 peaks at around 60 volts, which is equivalent to the breakdown voltage of the low side transistor switch 320. It should be noted that the voltage across the coil 110 during the off-phase lasts for a shorter period when the voltage suppressor 130 is not working than when compared to when the voltage compressor 130 is working (300 microseconds versus 500 microseconds).

In this way, catalytic reduction dosing systems can run more reliably whilst taking the advantage of broader compatibility mentioned earlier.

Figure 9:
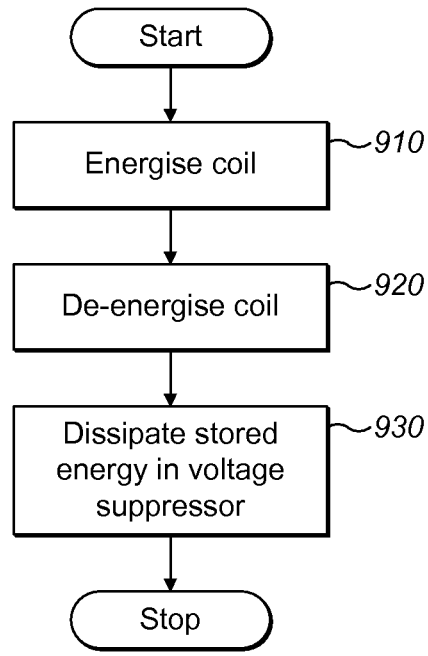
FIG. 9 is a flow chart of a method of discharging a coil of a dosing injector.

FIG. 9 is a flow chart of a method of discharging the coil 110 of SCR dosing injector 100. Here, as explained earlier, the coil 110 is energised by the driving circuit 300 at step 910. The coil 110 is then de-energised by the driving circuit 300 at step 920. The energy stored in the coil 110 is then dissipated through the voltage suppressor 130 at the beginning of the off-phase, when the voltage generated by the coil 110 exceeds the breakdown voltage of the voltage suppressor 130.

Figure 10:
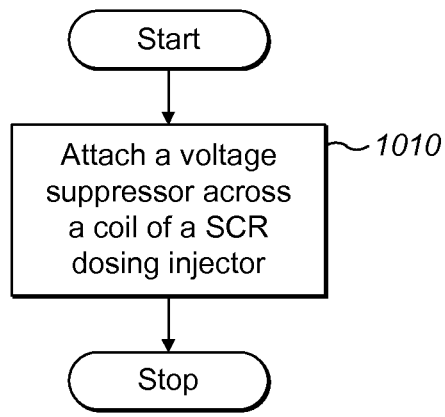
FIG. 10 is a flow chart of a method of assembling a dosing injector.

FIG. 10 is a flow chart of a method of assembling the SCR dosing injector 100. Here, the voltage suppressor 130 is attached across the coil 110 so as to achieve discharge of electrical energy stored in the coil 110 during the off-phase at step 1010. The voltage suppressor is attached using soldering techniques, but other suitable techniques could be used. The voltage suppressor 130 is attached in close proximity to the coil 110, and is attached to the coil 110 in such a way as to be able to share the cooling system of the coil 110. In particular, the voltage suppressor 130 is attached so as to be inside the same liquid-cooled jacket of the coil 110 or SCR dosing injector 100.

Figure 11:
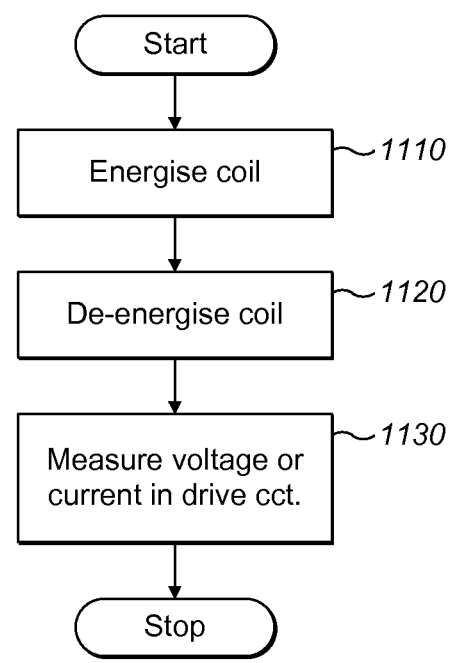
FIG. 11 is a flow chart of a method of diagnosing a fault in a coil of a dosing injector.

FIG. 11 is a flow chart of a method of diagnosing a fault in the coil 110 of the SCR dosing injector 100. Here, the coil 110 is energised by the driving circuit 300 at step 1110. The coil 110 is then de-energised by the driving circuit 300 at step 1120. A measurement is made by the diagnostic circuit 330 to sense current flowing through the sense resistor 332 or by the diagnostic circuit 430 to sense voltage in the voltage divider 432 at step 1130. Diagnostic circuit 330 is arranged to look for a decaying current, lasting for tens of microseconds, in the sense resistor 332. Diagnostic circuit 340 is arranged to look for a larger peak voltage and or a voltage lasting a shorter duration across the coil 110 than when compared with a situation in which the voltage suppressor 130 is operational. For example, the diagnostic circuit 430 may look for a voltage which is around the breakdown voltage of the voltage suppressor 130 (to indicate correct working) or a margin above the breakdown voltage of the voltage suppressor 130 (in this example 30 volts, or 33 volts in practice) (to indicate incorrect working of the voltage suppressor 130). Alternatively, or additionally, the diagnostic circuit 430 may look for a voltage which lasts for a time period above a certain threshold, say 350 microseconds for example, to indicate that the voltage suppressor is working correctly, or below the threshold to indicate that the voltage suppressor is not working correctly.

Although the invention has been described above with reference to one or more preferred embodiments, it will be appreciated that various changes or modifications may be made without departing from the scope of the invention as defined in the appended claims.

For example, the invention has been described in the context of a SCR dosing injector application but would find utility in other applications, such as fuel injectors and water injectors, especially in vehicular applications. In particular, the invention may find utility in fuel injectors, for example fuel injectors of the type used for injecting fuel into an exhaust system for catalyst regeneration. The invention may also find utility in water injectors, for example water injectors for injecting water into the intake manifold of a diesel engine to reduce emissions. Specifically, the invention would find particular use where the injector is an electrically actuated pump, preferably with cooling means, such as water-cooling means.

The invention claimed is:

1. A diagnostic circuit arranged to diagnose a fault in a voltage suppression circuit in a drive circuit of a fluid injector; said drive circuit adapted to energize a coil of said fluid injector, and wherein a voltage suppression circuit is arranged electrically in parallel with said coil, comprising
    means to detect the current through, or the voltage at, a point between the low side end of the coil/voltage suppression circuit parallel pair and ground, and
    means to compare, subsequent to the transition from an "on" to an "off" phase of the drive circuit, characteristics of said detected current or voltage with expected characteristics, and
    means to determine if there is a fault in said voltage suppression circuit from said comparison means based on said characteristics of said detected current or voltage differing from said expected characteristics by a predetermined extent.

2. The diagnostic circuit of claim 1, wherein the diagnostic circuit is adapted to measure said current or voltage during an off-phase of the drive circuit.

3. A diagnostic circuit arranged to diagnose a fault in a voltage suppression circuit in a drive circuit of a fluid injector; said drive circuit adapted to energize a coil of said fluid injector, and wherein a voltage suppression circuit is arranged electrically in parallel with said coil, comprising
    means to detect the current through, or the voltage at, a point between the low side end of the coil/voltage suppression circuit parallel pair and ground,
    means to compare, subsequent to the transition from an "on" to an "off" phase of the drive circuit, characteristics of said detected current or voltage with expected characteristics, and
    means to determine if there is a fault in said voltage suppression circuit from said comparison means based on said characteristics of said detected current or voltage differing from said expected characteristics by a predetermined extent,
    wherein the diagnostic circuit is adapted to measure said current or voltage during an off-phase of the drive circuit, and
    wherein the diagnostic circuit is arranged to measure the current or voltage during a time period of 500 microseconds from the beginning of the off-phase of the drive circuit.

4. The diagnostic circuit of claim 3, wherein the diagnostic circuit is arranged to measure said current through a sense resistor in the drive circuit.

5. The diagnostic circuit of claim 3, wherein the diagnostic circuit is arranged to determine whether the current is above a value selected from the group consisting of 0.1, 0.2 and 0.3 amps after a time period selected from the group consisting of 50, 75, 100, 150 and 200 microseconds.

6. The diagnostic circuit of claim 1, wherein the diagnostic circuit is arranged to measure said voltage through a voltage divider in the drive circuit.

7. The diagnostic circuit of claim 1, wherein the diagnostic circuit is arranged to determine whether said voltage is above a breakdown voltage of a PN junction of the voltage suppression circuit.

8. The diagnostic circuit of claim 7, wherein the diagnostic circuit is arranged to determine whether the voltage is above a breakdown voltage of the PN junction within 300 microseconds of the beginning of an off-phase of the drive circuit.

9. The diagnostic circuit of claim 1, wherein the diagnostic circuit and fluid injector are configured for use on a vehicle.

10. The diagnostic circuit of claim 1, wherein the fluid injector is one of a selective catalytic reduction dosing injector, a fuel injector and a water injector.

11. A method for diagnosing a fault in a voltage suppression circuit in a drive circuit of a fluid injector, said drive circuit adapted to energize a coil of said fluid injector, and wherein said voltage suppression circuit is arranged electrically in parallel with said coil, the method comprising:
    detecting the current through, or the voltage at, a point between the low side end of the coil/voltage suppression circuit parallel pair and ground, and
    comparing, subsequent to the transition from an "on" to an "off" phase of the drive circuit, characteristics of said detected current or voltage with expected characteristics, and
    determining if there is a fault in said voltage suppression circuit from said comparison based on said characteristics of said detected current or voltage differing from said expected characteristics by a predetermined extent.

* * * * *